(12) United States Patent
Sato

(10) Patent No.: US 8,273,992 B2
(45) Date of Patent: Sep. 25, 2012

(54) WIRING BOARD

(75) Inventor: Yoshiaki Sato, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/900,173

(22) Filed: Oct. 7, 2010

(65) Prior Publication Data

US 2011/0079419 A1   Apr. 7, 2011

(30) Foreign Application Priority Data

Oct. 7, 2009   (JP) ................... 2009-233880

(51) Int. Cl.
*H05K 1/09* (2006.01)

(52) U.S. Cl. ..................................... 174/257; 174/255

(58) Field of Classification Search .................. None
See application file for complete search history.

(56) References Cited

U.S. PATENT DOCUMENTS

| | | | |
|---|---|---|---|
| 6,710,258 B2 * | 3/2004 | Oggioni et al. ............... | 174/255 |
| 7,897,880 B1 * | 3/2011 | Goergen et al. ............... | 174/262 |
| 2002/0005292 A1 * | 1/2002 | Kaneda et al. ................. | 174/256 |
| 2007/0062729 A1 * | 3/2007 | Asai et al. ...................... | 174/262 |

FOREIGN PATENT DOCUMENTS

| | | |
|---|---|---|
| JP | 61-264796 | 11/1986 |
| JP | 2005-158424 | 5/2002 |
| JP | 2006-066451 | 3/2006 |

* cited by examiner

*Primary Examiner* — Ishwarbhai Patel
(74) *Attorney, Agent, or Firm* — Young & Thompson

(57) ABSTRACT

The wiring board includes: a base material; a copper pattern which is formed in one surface of the base material, and made of a first metal; and a first nickel land and a second nickel land which are formed over the copper pattern in contact with the copper pattern, and made of a second metal having a higher ionization tendency than that of the first metal, wherein a groove reaching the base material is formed in the copper pattern around a region overlapping the first nickel land at least when seen in a plan view.

11 Claims, 11 Drawing Sheets

WIRING BOARD

This application is based on Japanese patent application No. 2009-233880, the content of which is incorporated hereinto by reference.

BACKGROUND

1. Technical Field

The present invention relates to a wiring board.

2. Related Art

In a package structure in which electronic components such as a semiconductor element are mounted in a wiring board, the other surface of the wiring board on the side opposite to one surface in which the electronic components are mounted is provided with a plurality of terminals for further connecting the package structure to terminals of an external board such as a motherboard and the like. Solder balls are provided on such terminals, and the wiring board and the external board are electrically connected to each other through the solder balls.

Japanese Unexamined Patent Publication No. 2006-066451 discloses the following configuration. A metal thin film such as nickel is formed on a base insulating layer, and a metal wiring (copper) made of a metal having a smaller ionization tendency than the ionization tendency of a metal for forming the metal thin film is formed on the metal thin film by an additive method. A cover insulating layer for coating the metal wiring is formed so that the metal wiring is partially exposed on the base insulating layer as a terminal portion, and a protective insulating layer is formed so as to be tightly adjacent to the side around the terminal portion exposed from the cover insulating layer. Thereby, it is possible to prevent the metal thin film from being corroded, and to achieve the improvement of adhesion between the metal wiring and the base insulating layer.

Japanese Unexamined Patent Publication No. 2002-158424 discloses a printed-circuit board in which a resist is applied spaced apart from a copper pattern provided on a substrate of the printed-circuit board, the exposed outer surface of the copper pattern is coated with Ni plating spaced apart from the resist, and the Ni-plated exposed outer surface is coated with Au plating.

Japanese Unexamined Patent Publication No. 561-264796 discloses a configuration in which nickel is provided between a conductive path and an aluminum terminal while the conductive path such as copper is formed on the aluminum terminal. Thereby, the difference of the ionization tendency between aluminum and copper is reduced by using nickel.

SUMMARY

However the present inventor has found a problem that galvanic corrosion is generated in a configuration in which the nickel land sparsely disposed on the surface of the copper pattern.

In one embodiment, there is provided a wiring board including: a base material; a metal pattern which is formed over one surface of the base material, and made of a first metal; and a first land and a second land which are formed over the metal pattern in contact with the metal pattern, made of a second metal having a higher ionization tendency than that of the first metal, and electrically connected to each other through the metal pattern, wherein a groove reaching the base material is formed in the metal pattern around a region overlapping the first land at least when seen in a plan view.

According to this configuration, it is possible to increase the surface area of the second metal relative to the first metal, and to prevent galvanic corrosion from being generated, by providing the slit to the periphery of the region in which the first land of the metal pattern formed over the regions, in which a plurality of lands is formed, is formed. In addition, the insulating film is brought into contact with the base material by providing such a slit, and thus it is possible to improve adhesion between the insulating film and the base material, and to prevent delamination from being generated. Thereby, it is possible to prevent the second metal from being eluted, and to prevent a bad connection from being generated when the terminal of the wiring board is electrically connected to other members.

Meanwhile, arbitrary combinations of the above-mentioned components, and ones obtained by conversion of the expression of the invention among methods, devices and the like are also effective as the aspect of the invention.

According to the invention, it is possible to prevent a bad connection from being generated when the terminal of the wiring board is electrically connected to other members.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Before describing of the present invention, the related art will be explained in detail with reference to FIGS. 7A, 7B, 8A and 8B in order to facilitate the understanding of the present invention.

Figure 7A:
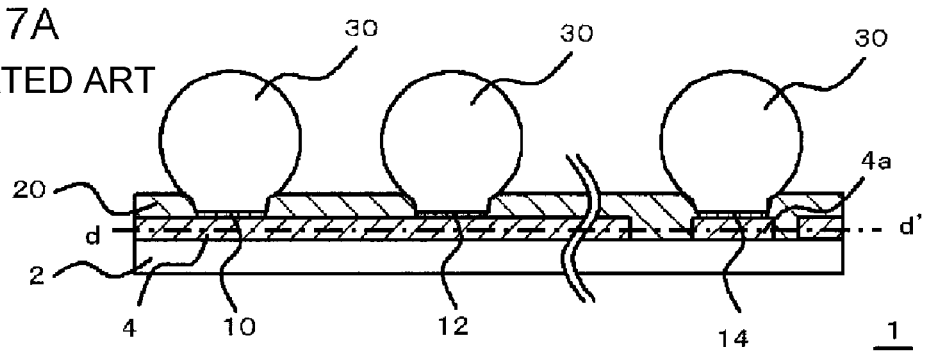
FIGS. 7A and 7B are cross-sectional views illustrating an example of the wiring board of the related art.
Figure 7B:
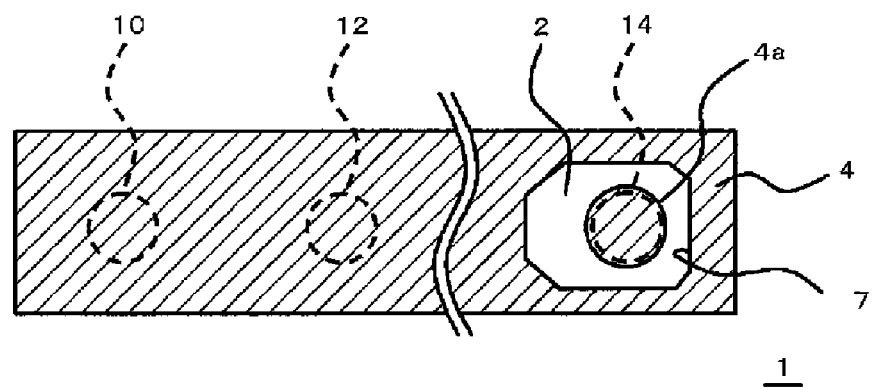

In the wiring board in which the electronic components are mounted, the terminals connected to the solder balls are configured as shown in FIGS. 7A and 7B. FIG. 7A is a cross-sectional view of a wiring board 1, and FIG. 7B is a plan view taken along the cross section of the line d-d' in FIG. 7A.

The wiring board 1 includes a base material 2, a copper pattern 4 formed on the base material 2, an isolated copper pattern 4a formed within an opening 7 which is formed in the copper pattern 4, and a solder resist 20 formed on the copper pattern 4 and the isolated copper pattern 4a. Here, the copper pattern 4 is a plane. A ground potential or a power supply potential, for example, is supplied to the copper pattern 4. On the other hand, the isolated copper pattern 4a is not electrically connected to the copper pattern 4, and is connected to, for example, a signal line. The wiring board 1 further includes a nickel land 10 and a nickel land 12 formed on the copper pattern 4 at the opening of the solder resist 20, a nickel land 14 formed on the isolated copper pattern 4a, and solder balls 30 formed respectively on the nickel land 10, the nickel land 12 and the nickel land 14. Here, the terminals are formed respectively by the copper pattern 4 and the nickel land 10 and the nickel land 12, and the isolated copper pattern 4a and the nickel land 14. Meanwhile, the solder resist 20 is not shown in FIG. 7B for the purpose of description.

The terminal includes a solder mask defined (SMD) type in which the opening of the solder resist is smaller than the terminal, and the exposed shape of the terminal is defined by the solder resist, and a non-solder mask defined (NSMD) type in which the opening of the solder resist is larger than the terminal. In an example shown in FIGS. 7A and 7B, the nickel land 10 and the nickel land 12 are formed on a copper pattern 104 which is a plane formed over a wide range of one surface of the base material 2, and are SMD types. The nickel land 14 is also shown as an SMD type, but the nickel land 14 may be formed as an NSMD type.

However, the present inventor has found a problem that a bad connection is generated in such a wiring board 1 when the terminals are electrically connected to other members, for example, under the conditions of high-temperature and high-humidity. The present inventor performed a PCT test in an atmosphere of high-temperature and high-humidity (121° C., 2.02 atm, saturated) in order to investigate this cause. As a result, the disappearance of nickel formed as a plated film, and thus the generation of a cavity between the solder ball 30 and the copper pattern 4 are considered to be the cause of such a bad connection.

Figure 8A:
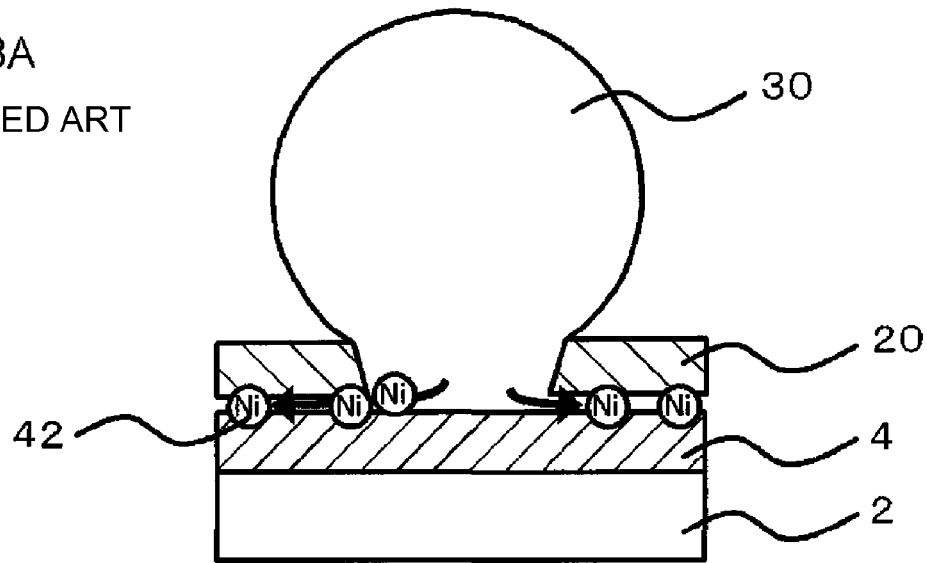
FIGS. 8A and 8B are cross-sectional views for explaining a problem of the wiring board of the related art.
Figure 8B:
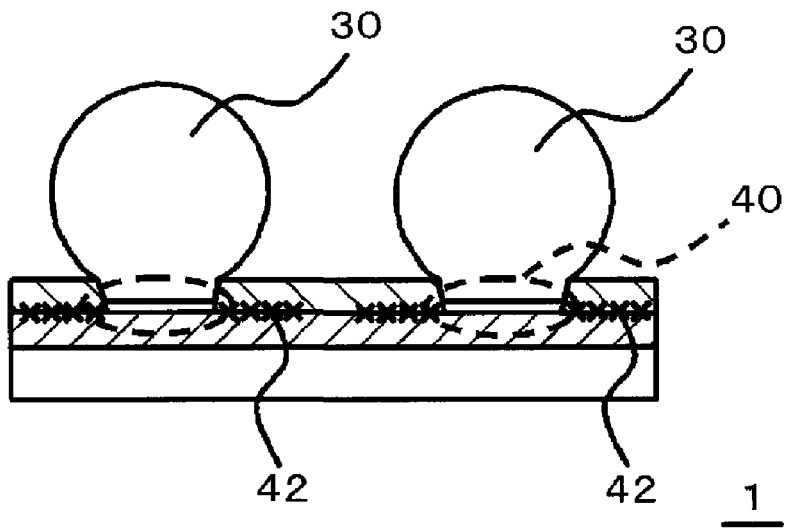

FIGS. 8A and 8B are diagrams for explaining this mechanism. For example, when delamination between the solder resist 20 and the copper pattern 4 is generated for an atmosphere of high-temperature and high-humidity and thus water is infiltrated during this time, copper and nickel are in contact with water. Since copper and nickel are different from each other in ionization tendency, a potential difference is generated between copper and nickel, and thus a galvanic battery is formed. Here, nickel having a higher ionization tendency than that of copper leaves electrons, is converted into Ni ions 42 and is then eluted in an electrolyte, which results in corrosion (galvanic corrosion) (FIG. 8A). When such Ni ions 42 are eluted, the nickel land 10 and the nickel land 12 between the copper pattern 4 and the solder ball 30 disappear and a cavity 40 is generated to thereby cause a bad connection (FIG. 8B). Meanwhile, it has been confirmed by an elementary analysis (EDX) that nickel flows out to a place shown by "42" in the drawing.

Here, the present inventor has found that nickel formed as a plated film disappears to thereby easily cause a bad connection, in the nickel land 10 and the nickel land 12 formed on the copper pattern 4 rather than the nickel land 14 formed on the isolated copper pattern 4a. Weak adhesion between the surrounding solder resist 20 and the copper pattern 4 in the nickel land 10 and the nickel land 12, and thus easy generation of delamination in the interface between the solder resist 20 and the copper pattern 4 are considered to be one of these causes. In addition, the influence of such corrosion (galvanic corrosion) becomes greater, as the potential difference of the metal to be contacted is greater, and as the area ratio of nickel to copper having a different ionization tendency is greater, that is, as the surface area of the metal having a low ionization tendency with respect to the metal having a high ionization tendency is relatively greater.

As shown in FIG. 7B, in the nickel land 10 and the nickel land 12 formed on the copper pattern 4 which is a plane, the surface area of nickel having a high ionization tendency with respect to the surface area of copper having a low ionization tendency becomes extremely small. For this reason, it is considered that galvanic corrosion is easily generated, and the Ni ions 42 are easily eluted.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, embodiments of the present invention will be descried with reference to the accompanying drawings. Throughout all of the drawings, like reference numerals denote like elements, and descriptions thereof will not be repeated.

Figure 1A:
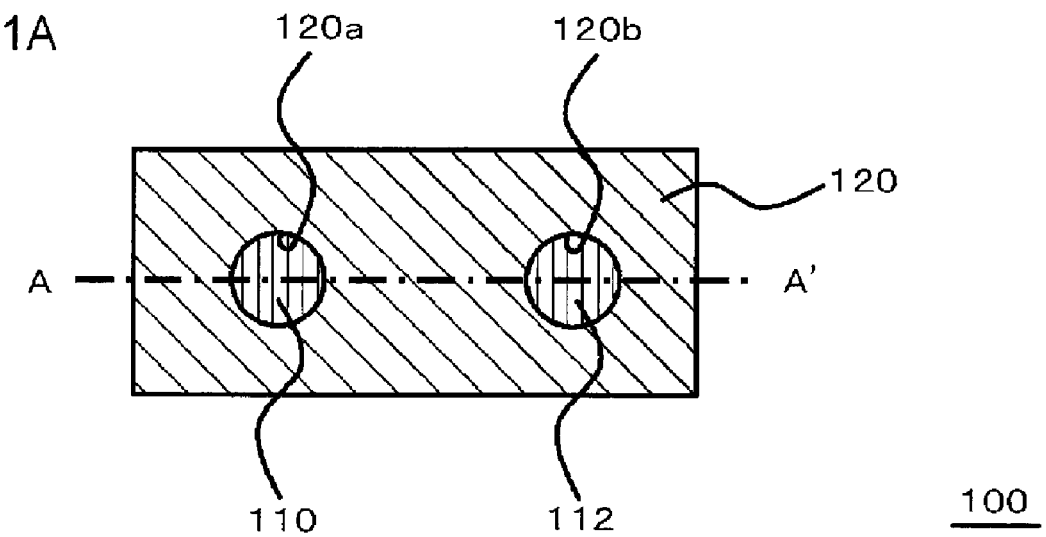
FIGS. 1A and 1B are plan views illustrating an example of the configuration of a wiring board according to an embodiment of the invention.
Figure 1B:
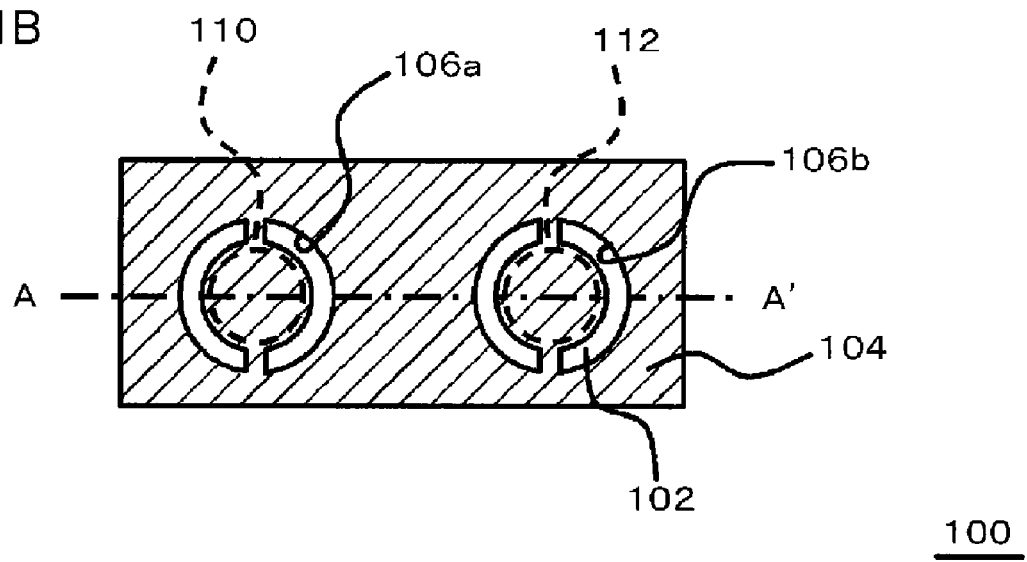
Figure 2A:
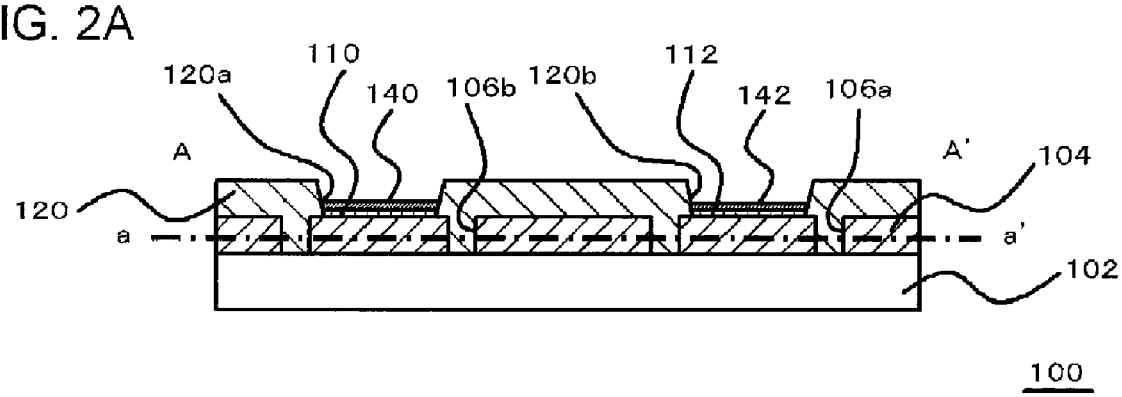
FIGS. 2A and 2B are cross-sectional views illustrating an example of the configuration of the wiring board according to the embodiment of the invention.
Figure 2B:
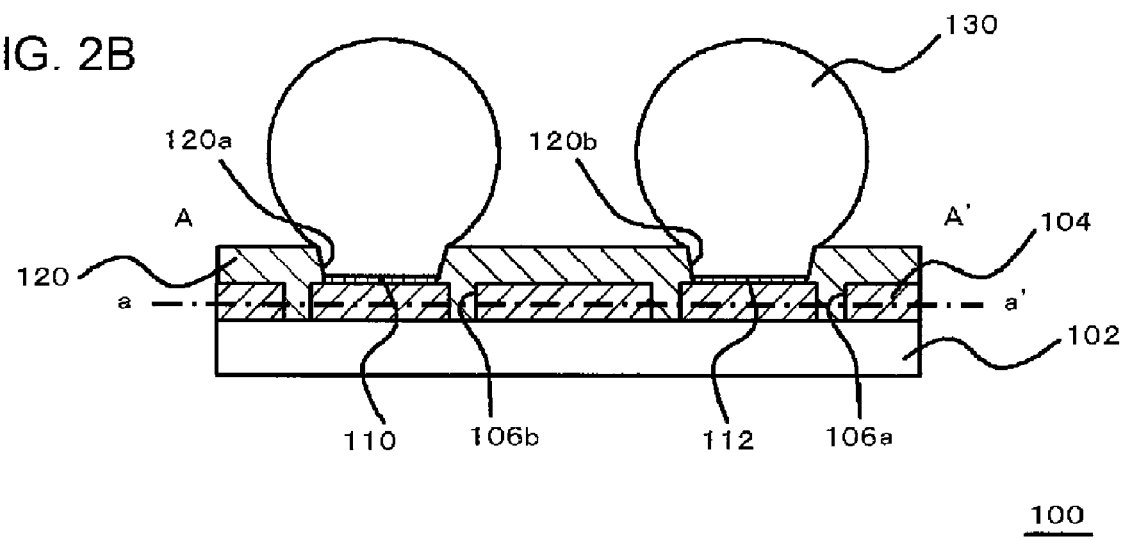

FIGS. 1A and 1B are plan views illustrating the configuration of a wiring board 100 according to the embodiment. In addition, FIGS. 2A and 2B are cross-sectional views illustrating the configuration of the wiring board 100 according to the embodiment. FIG. 2A is a cross-sectional view taken along the line A-A' in FIG. 1A. FIG. 1B is a plan view taken along the cross section of the line a-a' in FIG. 2A.

The wiring board 100 includes a base material 102, a copper pattern 104 (metal pattern) which is formed on one surface (upper surface in the drawing) of the base material 102 and is made of copper (first metal), and a solder resist 120 (insulating film) formed on the copper pattern 104. The base material 102 includes an insulating material and a wiring pattern, and may be formed as a laminated structure in which, for example, a wiring layer and a resin layer (insulating layer) are alternately laminated. The base material 102 may be substrate, for example.

The wiring board 100 further includes a first nickel land 110 (first land) and a second nickel land 112 (second land) which are formed on the copper pattern 104 and are made of nickel (second metal) having a higher ionization tendency than that of copper, and solder balls 130 formed respectively on the first nickel land 110 and the second nickel land 112, in a first opening 120a and a second opening 120b of the solder resist 120. Here, terminals are respectively formed by the first nickel land 110, the second nickel land 112, and the copper pattern 104. In addition, anti-oxidation layers 140 and 142 are respectively formed on the first nickel land 110 and the second nickel land 112. The anti-oxidation layers 140 and 142 are made of, for example, gold.

Meanwhile, FIG. 2A shows a state of the wiring board 100 before the solder balls 130 are formed on the first nickel land 110 and the second nickel land 112. In addition, the solder resist 120 is not shown in FIG. 1A for the purpose of description. Further, in FIG. 1B, places in which the first nickel land 110 and the second nickel land 112 are formed are shown by a broken line for the purpose of description. In FIGS. 1A and 1B, anti-oxidation layers 140 and 142 (not shown) are also formed respectively on the first nickel land 110 and the second nickel land 112. In the embodiment, the wiring board 100 may be formed as, for example, a ball grid array (BGA) board having a ground pin for external connection. Although not shown, the wiring board 100 is electrically connected to terminals of an external board such as a motherboard and the like through the solder balls 130. In addition, electronic components such as a semiconductor element are mounted in the surface (lower surface in the drawing) opposite to one surface of the base material 102 of the wiring board 100.

Here, the first nickel land 110 and the second nickel land 112 are SMD types which are selectively formed within regions specified by the first opening 120a and the second opening 120b of the solder resist 120, respectively. After the solder resist 120 is formed on the copper pattern 104 and the first opening 120a and the second opening 120b are formed, the first nickel land 110 and the second nickel land 112 may be formed as, for example, plated films which are formed on the copper pattern 104 exposed from the first opening 120a and the second opening 120b through plating processing.

FIG. 2B shows a state of the wiring board 100 after the solder balls 130 are formed on the first nickel land 110 and the second nickel land 112. The anti-oxidation layers 140 and 142 formed on the first nickel land 110 and the second nickel land 112 are incorporated into the solder balls 130 at the time of the formation of the solder balls 130. For this reason, the anti-oxidation layers 140 and 142 vanish from over the first nickel land 110 and the second nickel land 112. At this time, the wiring board 100 has a structure provided with the first nickel land 110 and the second nickel land 112 on the copper pattern 104, and provided with the gold-containing solder balls 130 thereon.

As shown in FIG. 1B, the first nickel land 110 and the second nickel land 112 are electrically connected to each other through the copper pattern 104. Here, the copper pattern 104 is a plane formed over a wide range of one surface of the base material 102. A ground potential or a power supply potential is supplied to the copper pattern 104.

In this specification, for example, "a plane" includes a power plane or a GND plane. In this case, the plane generally has wire width which is wider than that of a signal interconnect line, for example about equal to or more than 20 μm. "The plane" also includes, for example, an island shaped pattern, a dummy pattern or the like which can improve even the pattern density. The island shaped pattern and the dummy pattern may not electrically affect to the circuit operation. The island shaped pattern or the dummy pattern may be electrically floated. A land portion may be formed on the island shaped pattern or the dummy pattern.

In the embodiment, the groove may be a slit. In this embodiment, a slit 106a and a slit 106b reaching the base material 102 are respectively formed in the copper pattern 104 around regions overlapping the first nickel land 110 and the second nickel land 112 when seen in a plan view. Here, the copper pattern 104 includes a region overlapping with the first nickel land 110. The slit 106a is formed along the outer circumference of the region overlapping the first nickel land 110 so as to separate the region overlapping the first nickel land 110 from another region formed outer of the slit 106a. The copper pattern 104 is in a shape including, in a portion of the outer circumference of the region overlapping the first nickel land 110, a connection portion which connects the region overlapping the first nickel land 110 and another region formed in the outer circumference of the slit 106a. The slit 106b also has the same shape as that of the slit 106a, and is formed along the outer circumference of a region overlapping the second nickel land 112 so as to separate the region overlapping the second nickel land 112 from another region formed outer of the slit 106b. The copper pattern 104 is formed in a shape including, in a portion of the outer circumference of the region overlapping the second nickel land 112, a connection portion which connects the region overlapping the second nickel land 112 and another region formed in the outer circumference of the slit 106b. In the example shown in FIGS. 1A and 1B, two connection portions are provided.

In addition, the slit 106a and the slit 106b may be formed on the insulating material of the base material 102. Thereby, the solder resist 120 formed on the copper pattern 104 is in contact with the insulating material of the base material 102, and thus it is possible to improve adhesion between the solder resist 120 and the base material 102.

When the first nickel land 110 and the second nickel land 112 are formed on the copper pattern 104 which is a plane in this way, the surface area of nickel having a high ionization tendency, on its own, becomes far smaller than the surface area of copper having a low ionization tendency as mentioned above, and thus galvanic corrosion is easily generated. However, in the embodiment, it is possible to increase the surface area of nickel relative to copper by providing the slits to the peripheries of the regions in which the first nickel land 110 and the second nickel land 112 of the copper pattern 104 are formed, and to prevent galvanic corrosion from being generated. In addition, it is possible to prevent nickel from being eluted by improving adhesion between the solder resist 120 and the base material 102.

Figure 3A:
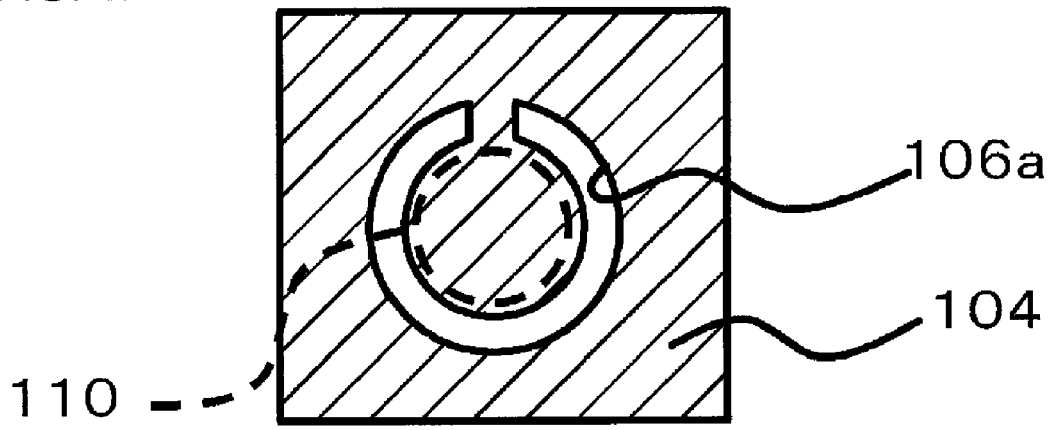
FIGS. 3A to 3C are plan views illustrating another example of a slit formed in a copper pattern according to the embodiment of the invention.
Figure 3B:
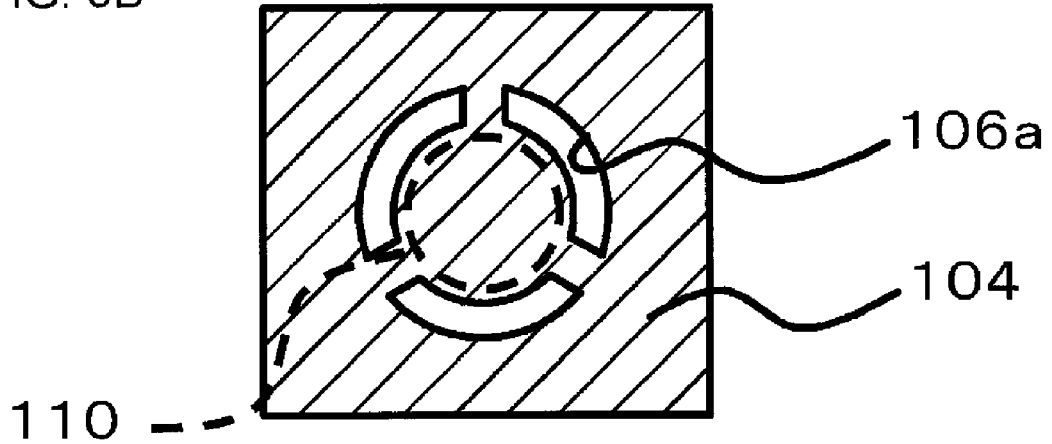
Figure 3C:
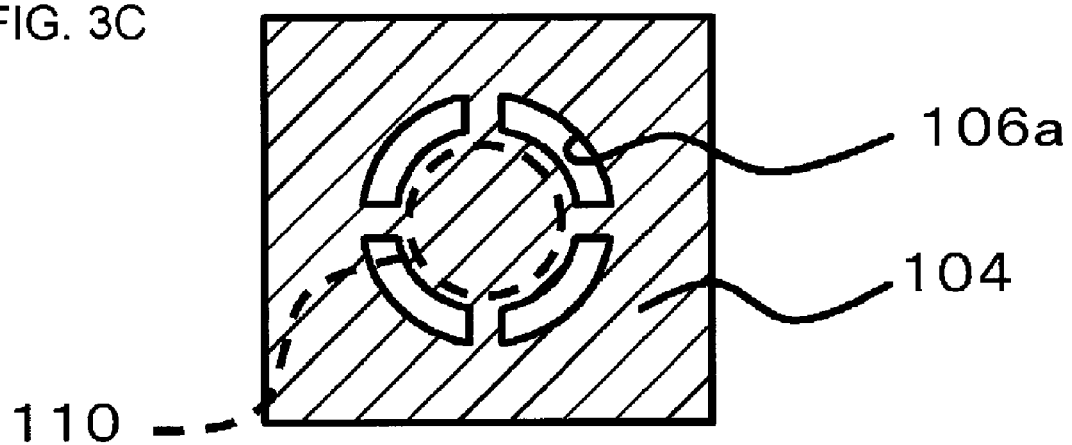

FIGS. 3A to 3C are plan views illustrating another example of the slit 106a formed in the copper pattern 104. Here, a place in which the first nickel land 110 is formed is shown by a broken line for the purpose of description. In addition, although the configuration of the slit 106a is shown herein, the same may be true of the slit 106b.

For example, the slit 106a may be formed along the outer circumference of a region overlapping the first nickel land 110 so as to separate the region overlapping the first nickel land 110 from another region formed outer of the slit 106a as shown in FIG. 3A. The copper pattern 104 is formed in a shape including, in a portion of the outer circumference of the region overlapping the first nickel land 110, a connection portion which connects the region overlapping the first nickel land 110 and another region formed in the outer circumference of the slit 106b. Here, the copper pattern 104 includes one connection portion.

In FIG. 3B, three connection portions are provided. In FIG. 3C, four connection portions are provided. Here, when the copper pattern 104 includes a plurality of connection portions, these connection portions, for example, can be uniformly dispersed and disposed. Thereby, electrical connections of the region overlapping the first nickel land 110 used as a terminal of the copper pattern 104 and another region are dispersed, and thus connection resistance can be lowered.

The copper pattern 104 according to the embodiment may be manufactured by the same manufacturing process as that of a typical plane in the wiring board, just by providing a different mask.

In other words, the slit 106a and the slit 106b formed in the copper pattern 104 may be formed using a mask having a desired shaped opening. For example, after the copper pattern is formed on the whole surface of the base material 102, they may be formed by partially removing the copper pattern using a mask in which a place corresponding to the slit 106 is opened. In addition, the copper pattern 104 may be also formed in a place other than the slit 106, using a mask for protecting the place corresponding to the slit 106.

Figure 4A:
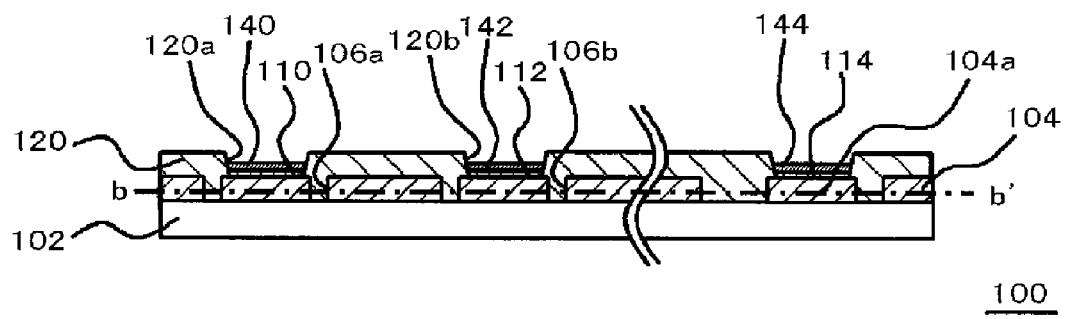
FIGS. 4A and 4B are diagrams illustrating another region of the wiring board according to the embodiment of the invention.
Figure 4B:
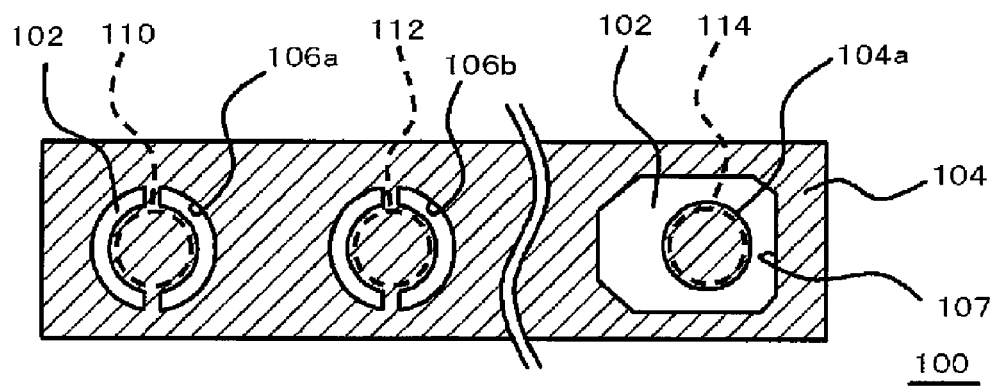

FIGS. 4A and 4B are diagrams additionally illustrating another region of the wiring board 100 according to the embodiment. FIG. 4A is a cross-sectional view of the wiring board 100, and FIG. 4B is a plan view taken along the cross section of the line b-b' in FIG. 4A.

An isolated copper pattern 104a, which is formed within an opening 107 formed in the copper pattern 104 which is a plane and is not electrically connected to the copper pattern 104, may be formed in the wiring board 100. The isolated copper pattern 104a is connected to, for example, a signal line through a via and the like, not shown, in the wiring board 100. A third nickel land 114 is formed on the isolated copper pattern 104a. In addition, an anti-oxidation layer 144 is formed on the third nickel land 114. The anti-oxidation layer 144 is made of, for example, gold. Even in the case of FIG. 4A, the solder balls 130 may be formed respectively on the first nickel land 110, the second nickel land 112, and the third nickel land 114. In addition, the solder resist 120 is not shown in FIG. 4B for the purpose of description. In such a configuration, since the third nickel land 114 is formed on the isolated copper pattern 104a, the surface area of nickel relative to copper is essentially high. For this reason, the configuration in the vicinity of the third nickel land 114 may have the same configuration as the related art.

Figure 5:
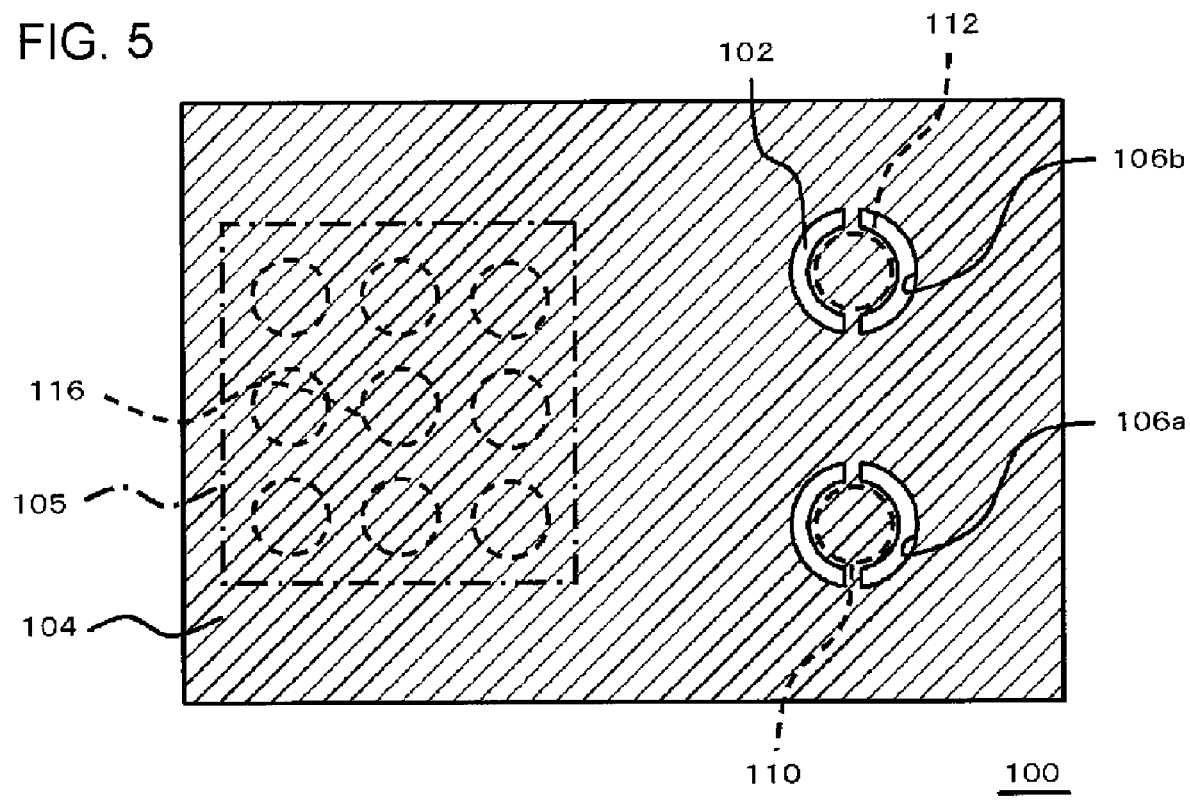
FIG. 5 is a plan view illustrating another region of the wiring board according to the embodiment of the invention.

FIG. 5 is a plan view additionally illustrating still another region of the wiring board 100 according to the embodiment.

Here, the nickel land formed on the copper pattern 104 may include a nickel land which is be separated widely from other nickel lands formed in the periphery thereof and a nickel land which is separated narrowly from other nickel lands formed in the periphery thereof. In FIG. 5, the nickel lands are shown by a broken line for the purpose of description. In addition, a place having a small gap between the nickel lands is shown surrounded by one dot-dashed line.

Here, the nickel lands in a region 105 surrounded by one dot-dashed line are formed on the copper pattern 104, and may be electrically connected to the copper pattern 104. For example, a fourth nickel land 116 formed within the region 105 is configured such that the periphery thereof is surrounded by other nickel lands, and is separated narrowly from other nickel lands. In such a region 105, since the surface area of nickel relative to copper is large to some extent, it is essentially difficult to generate galvanic corrosion. For this reason, the region on which such a fourth nickel land 116 is formed may have a configuration in which the copper pattern 104 on the periphery thereof is not provided with a slit.

That is, in the embodiment, a place in which the nickel lands are sparsely disposed can be selectively provided with a slit such as the slit 106a for each nickel land, depending on a shape of the copper pattern 104 on the periphery thereof, and a disposition state of other nickel lands on the periphery.

As an example, for example, in a predetermined range of a region including the region on which each nickel land is formed, the periphery thereof may be selectively provided with a slit when the ratio of the surface area of copper is equal to or more than a predetermined value, and the ratio of the surface area of nickel to copper is equal to or less than a predetermined value. For example, when the radius (radius of the nickel land) of an opening opened at the solder resist 120 is set to r, a region surrounded by a circle, having a radius of 8.9 r, centering on the center of nickel land to be focused is set to a predetermined range. Here, the area in a predetermined range is set to $D_p$, the surface area of the copper pattern in the predetermined range is set to $D_c$, and the surface area of nickel in the predetermined range is set to $D_n$. In this case, for example, when $D_c$ is equal to or more than ½ of the area of $D_p$, and the ratio of $D_n$ to $D_c$ is equal to or more than 2.5%, the periphery of the nickel land may be provided with a slit.

In the example shown in FIG. 5, although the peripheries of the first nickel land 110 and the second nickel land 112 separated widely from the other nickel lands are respectively provided with the slit 106a and the slit 106b, the peripheries of the nickel lands such as the fourth nickel lands 116 formed within the region 105 are not provided with the slit.

With such a configuration, since a place, having a low disposition ratio of the nickel lands to the copper pattern 104, which includes a region sufficient for providing a slit, is selectively provided with a slit, and a place having a small gap between the nickel lands is not provided with a slit, it is possible to prevent the area from being increased. It is possible to prevent a bad connection from being generated when the terminal of the wiring board is electrically connected to other members.

Figure 6A:
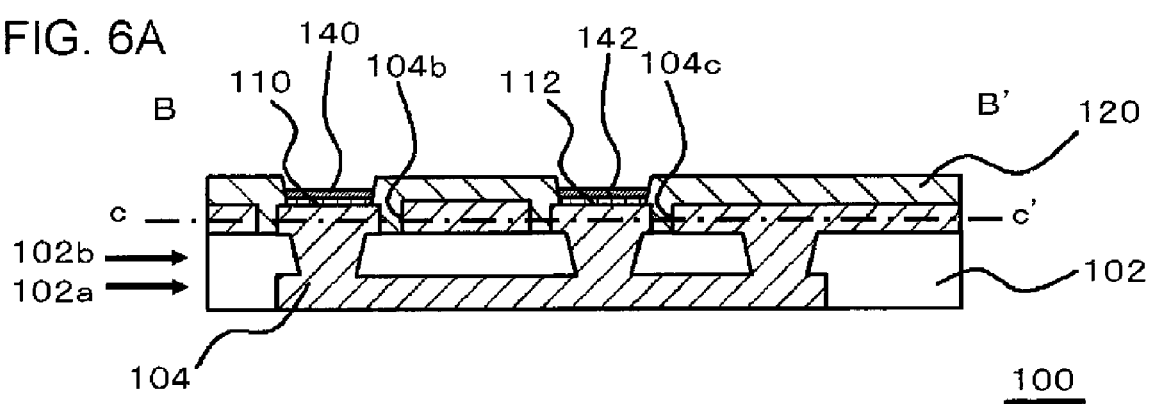
FIGS. 6A and 6B are diagrams illustrating another example of the configuration of the wiring board according to the embodiment of the invention.
Figure 6B:
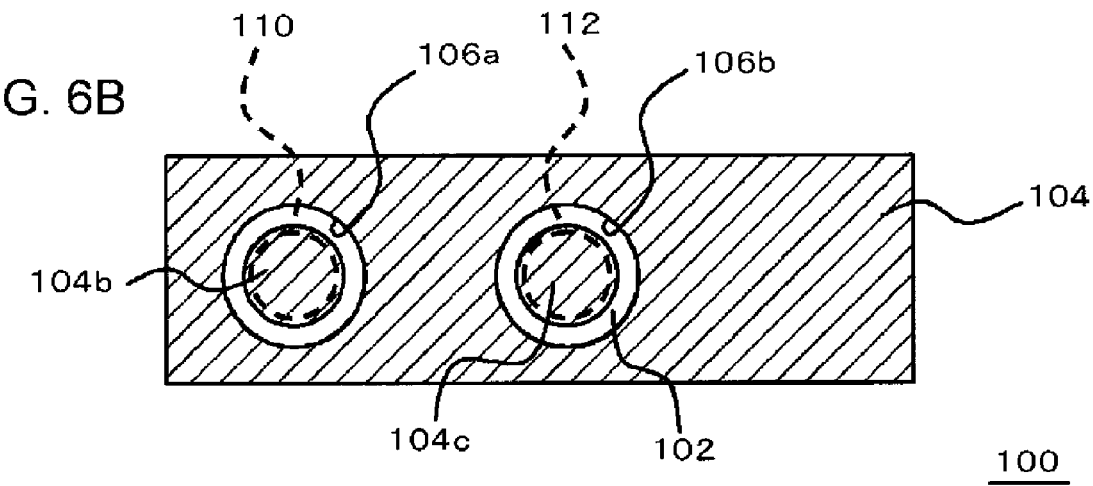

FIGS. 6A and 6B are diagrams illustrating another example of the configuration of the wiring board 100 according to the embodiment. FIG. 6A is a cross-sectional view of the wiring board 100, and FIG. 6B is a plan view taken along the cross section of the line c-c' in FIG. 6A.

Here, the slit 106a and the slit 106b formed respectively in the peripheries of the regions (104b and 104c) overlapping the first nickel land 110 and the second nickel land 112 in the copper pattern 104 may be formed along the entirety of outer circumferences of the copper pattern 104b and the copper pattern 104c so as to separate the copper pattern 104b and the copper pattern 104c from a region formed outer of the slit 106a and the slit 106b. Here, the copper pattern 104 is formed as a via and a wiring in a second layer 102b and even in an underlying first layer 102a of the base material 102. The first nickel land 110 and the second nickel land 112 are electrically connected to each other through the wiring or the via formed in the base material 102. In this case, the slit 106a and the slit 106b are not formed on the wiring or the via of the base material 102, but formed on the insulating material.

Here, the copper pattern 104 may be formed as a plane which is formed in a wide region of the outer circumferences of the slit 106a and the slit 106b on one surface of the base material 102. In addition, as another example, the copper pattern 104 may be formed as a plane which is formed in a wide region at the first layer 102a.

Figure 9A:
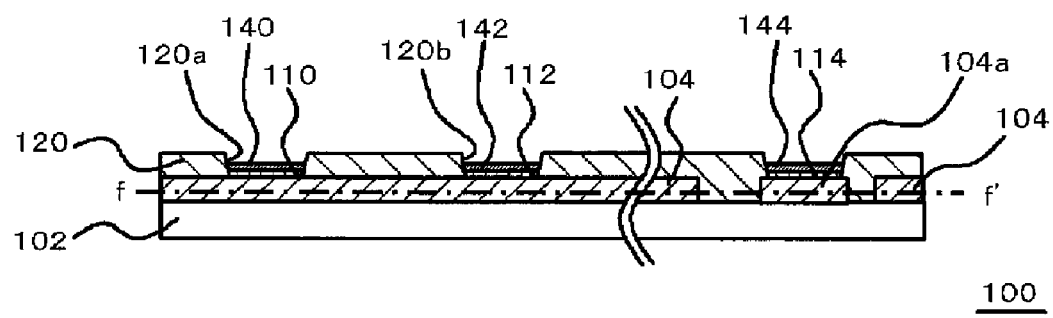
FIGS. 9A and 9B are diagrams illustrating another example of the configuration of the wiring board according to the embodiment shown in FIGS. 4A and 4B.
Figure 9B:
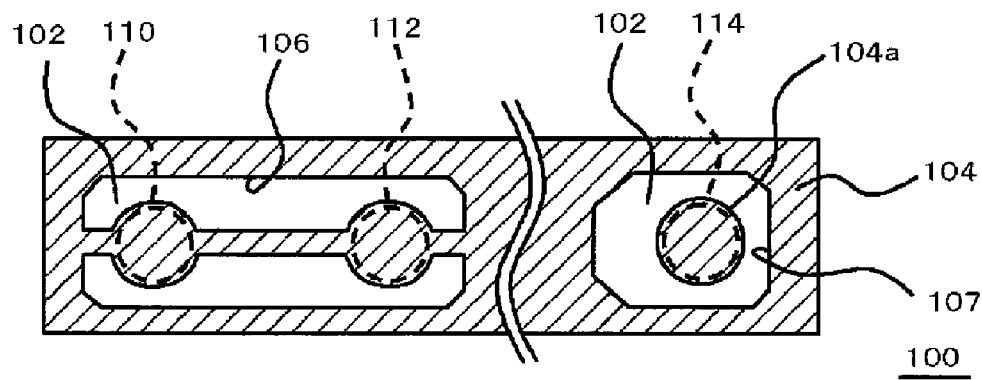

FIGS. 9A and 9B are diagrams illustrating another example of the configuration of the wiring board 100 according to the embodiment shown in FIGS. 4A and 4B. FIG. 9A is a cross-sectional view of the wiring board 100, and FIG. 9B is a plan view taken along the cross section of the line f-f' in FIG. 9A. Even in the case of FIG. 9A, the solder balls 130 may be formed respectively on the first nickel land 110, the second nickel land 112, and the third nickel land 114. In addition, the solder resist 120 is not shown in FIG. 9B for the purpose of description.

Here, the first nickel land 110 and the second nickel land 112 are surrounded by the same slit 106. The slit 106 is formed so as to surround the first nickel land 110 and the second nickel land 112. Here, the copper pattern 104 is formed in a shape passing through the center of the slit 106 so that the regions overlapping the first nickel land 110 and the second nickel land 112 are connected to the surrounding copper pattern 104.

Figure 10:
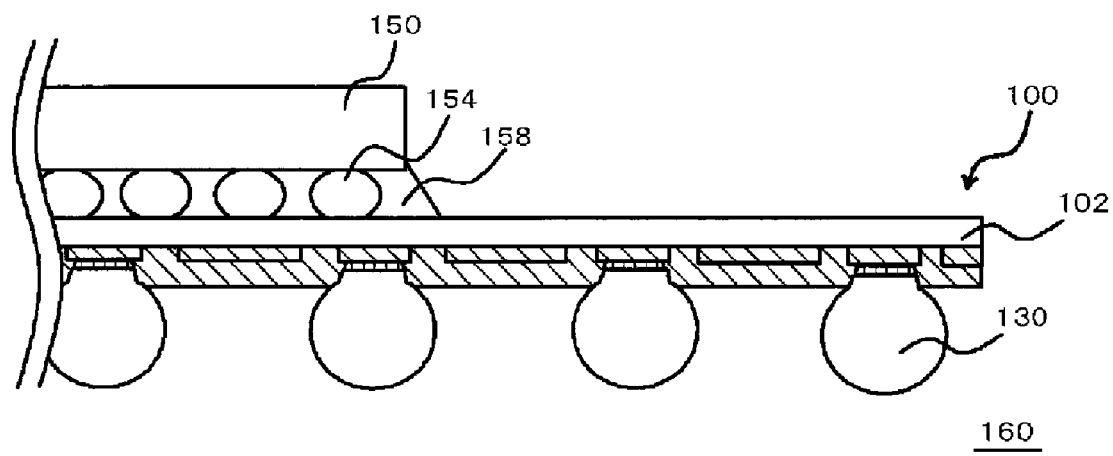
FIG. 10 is a cross-sectional view illustrating the configuration of a semiconductor device using the wiring board according to the embodiment shown in FIGS. 2A and 2B.

FIG. 10 is a cross-sectional view illustrating the configuration of a semiconductor device 160 using the wiring board 100 according to the embodiment shown in FIGS. 2A and 2B. In FIG. 10, a semiconductor element 150 is mounted in the surface (upper surface in the drawing) opposite to one surface of the base material 102 of the wiring board 100. In addition, the semiconductor element 150 is flip-chip connected to the wiring board 100 through a solder ball 154. In addition, an underfill resin 158 is filled between the semiconductor element 150 and the wiring board 100. Thereby, the semiconductor device 160 is formed. The semiconductor device 160 is, for example, a BGA package.

Figure 11:
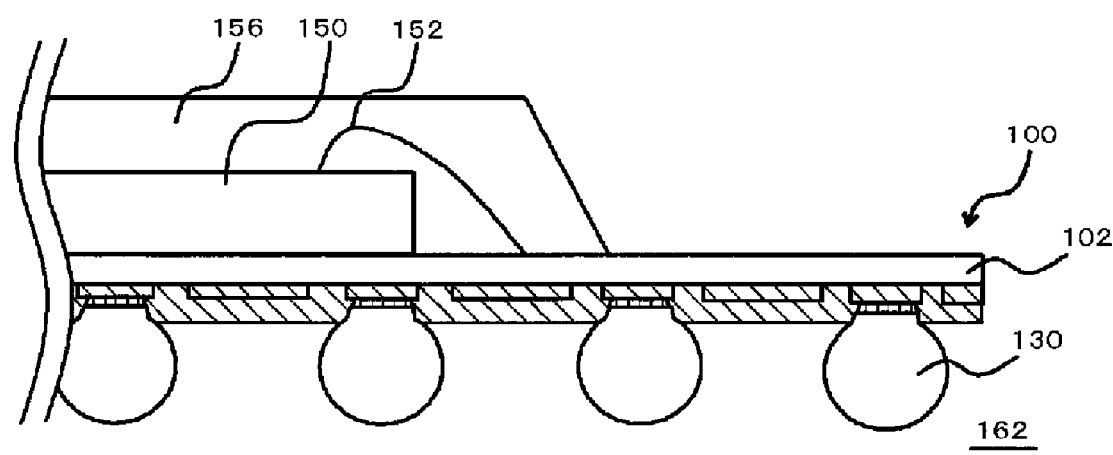
FIG. 11 is a cross-sectional view illustrating the configuration of the semiconductor device using the wiring board according to the embodiment shown in FIGS. 2A and 2B.

FIG. 11 is a cross-sectional view illustrating the configuration of a semiconductor device 162 using the wiring board 100 according to the embodiment shown in FIGS. 2A and 2B.

In FIG. 11, the semiconductor element 150 is mounted in the surface (upper surface in the drawing) opposite to one surface of the base material 102 of the wiring board 100. In addition, the semiconductor element 150 is electrically connected to the wiring board 100 through a bonding wire 152. The semiconductor element 150 and the bonding wire 152 are sealed by a molding resin 156. Thereby, the semiconductor device 162 is formed.

Figure 12:
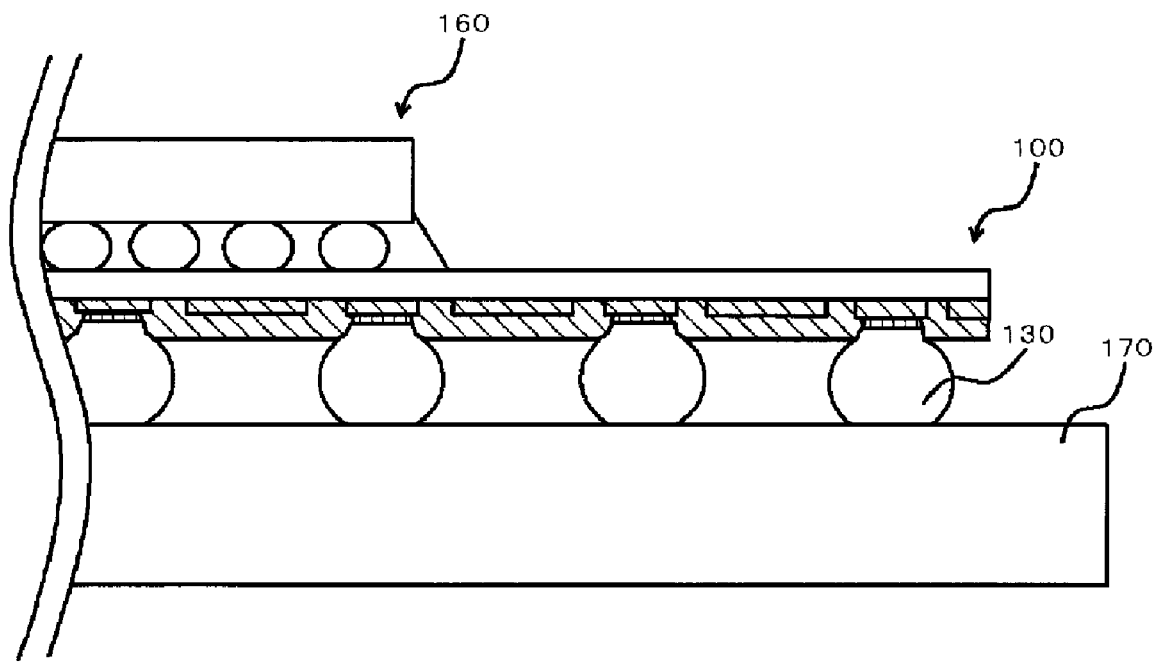
FIG. 12 is a cross-sectional view illustrating the configuration when the semiconductor device using the wiring board according to the embodiment shown in FIG. 10 is mounted on an external board.

FIG. 12 is a cross-sectional view illustrating the configuration in the case where the semiconductor device 160 using the wiring board 100 according to the embodiment shown in FIG. 10 is mounted on the external board 170. In this case, the semiconductor device 160 is electrically connected to an external terminal (not shown) provided to an external board 170 through the solder balls 130 formed in the wiring board 100.

Next, the effect of the wiring board 100 according to the embodiment will be described.

As seen from the above, in the embodiment, it is possible to increase the surface area of nickel relative to copper, and to prevent galvanic corrosion from being generated, by providing the slits to the peripheries of the regions in which the first nickel land 110 and the second nickel land 112 of the copper pattern 104 are formed. In addition, the solder resist 120 is brought into contact with the insulating material of the base material 102 by providing such slits, and thus it is possible to improve adhesion between the solder resist 120 and the base material 102, and to prevent delamination from being generated. Thereby, it is possible to prevent nickel from being eluted, and to prevent a bad connection from being generated when the terminal of the wiring board 100 is electrically connected to other members.

In performing a PCT test in the same atmosphere of high-temperature and high-humidity (121° C., 2.02 atm, saturated) as that of the example shown in FIGS. 7A and 7B in the wiring board 100 of the configuration shown in FIGS. 4A and 4B, the elution of nickel was not observed even in the first nickel land 110 and the second nickel land 112.

As described above, although the embodiment of the invention has been set forth with reference to the drawings, it is merely illustrative of the invention, and various configurations other than those stated above may be adopted.

In the embodiment mentioned above, although the case where the first metal is copper and the second metal is nickel has been described by way of example, the combination of other metals may be applied to the first metal and the second metal when the second metal has a higher ionization tendency than that of the first metal.

It is apparent that the present invention is not limited to the above embodiment, and may be modified and changed without departing from the scope and spirit of the invention.

What is claimed is:

1. A wiring board comprising:
    a base material;
    a metal pattern which is formed over one surface of said base material, and made of a first metal;
    a first land and a second land which are formed over said metal pattern in contact with said metal pattern, made of a second metal having a higher ionization tendency than that of said first metal, and electrically connected to each other through said metal pattern; and
    an insulating film formed over said metal pattern over said one surface of said base material, in which a first opening and a second opening that open respectively over said first land and said second land are formed,
    wherein a groove reaching said base material is formed in said metal pattern around a region overlapping with said first land at least when seen in a plan view.

2. The wiring board as set forth in claim 1,
    wherein said first land and said second land are selectively formed within regions specified by said first opening and said second opening of said insulating film, respectively.

3. The wiring board as set forth in claim 1, wherein said groove is formed along the outer circumference of said region so as to separate said region within said outer circumference from another region formed outer of said groove, and said metal pattern further includes a connection portion formed at a portion of the outer circumference of said region for connecting said region and said another region formed outer of said groove.

4. The wiring board as set forth in claim 1, wherein said base material includes a wiring layer in which a wiring made of said first metal is formed,
    said groove is formed along the outer circumference of said region so as to separate said region within said outer circumference from another region formed outer of said groove, and
    said region is electrically connected to said second land through said wiring of said wiring layer of said base material.

5. The wiring board as set forth in claim 4, wherein said region is connected to said another region formed outer of said groove through said wiring of said wiring layer of said base material.

6. The wiring board as set forth in claim 1, wherein said first metal is copper.

7. The wiring board as set forth in claim 1, wherein said second metal is nickel.

8. The wiring board as set forth in claim 1, wherein said metal pattern is a plane.

9. The wiring board as set forth in claim 1, wherein a power supply potential or a ground potential is applied to said first land and said second land through said metal pattern.

10. The wiring board as set forth in claim 1, wherein said base material includes an insulating material and a wiring pattern, and said groove of said metal pattern is formed over said insulating material of said base material.

11. A wiring board comprising:
    a base material;
    a metal pattern which is formed over one surface of said base material, and made of a first metal; and
    a first land and a second land which are formed over said metal pattern in contact with said metal pattern and that are each adapted to receive a respective solder ball mounted thereon, said first land and said second land being made of a second metal having a higher ionization tendency than that of said first metal and being electrically connected to each other through said metal pattern,
    wherein a groove reaching said base material is formed in said metal pattern around a region in which said first land and said metal pattern overlap when seen in a plan view, and
    wherein said metal pattern in said region contacts said metal pattern outside said groove and said first land in said region does not extend outside said groove.

* * * * *